(12) United States Patent
Tsironis

(10) Patent No.: US 11,462,809 B1
(45) Date of Patent: Oct. 4, 2022

(54) HIGH-SPEED HIGH-RESOLUTION SLIDE SCREW TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 203 days.

(21) Appl. No.: 17/015,849

(22) Filed: Sep. 9, 2020

(51) Int. Cl.
  *H01P 5/04* (2006.01)
  *F16H 25/20* (2006.01)
  *H03H 7/40* (2006.01)

(52) U.S. Cl.
  CPC .............. *H01P 5/04* (2013.01); *F16H 25/20* (2013.01); *H03H 7/40* (2013.01); *F16H 2025/2081* (2013.01); *F16H 2025/2096* (2013.01)

(58) Field of Classification Search
  CPC ... H01P 5/04; H03H 7/40; F16H 25/20; F16H 2025/2081; F16H 2025/2096
  See application file for complete search history.

(56) References Cited

U.S. PATENT DOCUMENTS

| | | | |
|---|---|---|---|
| 9,257,963 B1* | 2/2016 | Tsironis | H03H 7/40 |
| 9,625,556 B1 | 4/2017 | Tsironis | |
| 10,725,094 B1* | 7/2020 | Tsironis | G01R 31/2621 |
| 10,804,872 B1* | 10/2020 | Tsironis | H03H 7/38 |
| 10,971,791 B1* | 4/2021 | Tsironis | H01P 5/04 |
| 11,095,013 B1* | 8/2021 | Tsironis | H02N 2/026 |
| 11,156,656 B1* | 10/2021 | Tsironis | G01R 27/32 |
| 11,217,870 B1* | 1/2022 | Tsironis | H01P 5/04 |
| 11,327,101 B1* | 5/2022 | Tsironis | H03H 7/40 |
| 2007/0222539 A1* | 9/2007 | Antkowiak | H01P 5/183 333/115 |
| 2022/0082614 A1* | 3/2022 | Brearley | H01P 5/04 |

OTHER PUBLICATIONS

"Computer Controlled Microwave Tuner, CCMT", Product Note 41, Focus Microwaves Inc. 1998.
Stepper motors [online], Wikipedia [retrieved on Jul. 3, 2020]. Retrieved from Internet <URL: https://en.wikipedia.org/wiki/Stepper_motor>.

* cited by examiner

*Primary Examiner* — David M Fenstermacher

(57) ABSTRACT

A slide screw tuner movement control mechanism uses two horizontal stepper motors driving the ACME lead screw, which controls the horizontal position of the mobile carriage moving the tuning probe along the slabline. Each motor is linked with the ACME using different gear ratio, designed for coarse and fine horizontal increment (step size). This allows making ultra-wideband tuners with Fmax:Fmin>10:1 for optimized tuning speed at low frequencies and high tuning resolution at high frequencies. Appropriate calibration and optimized movement algorithms extract the best compromise between speed and tuning resolution.

6 Claims, 11 Drawing Sheets

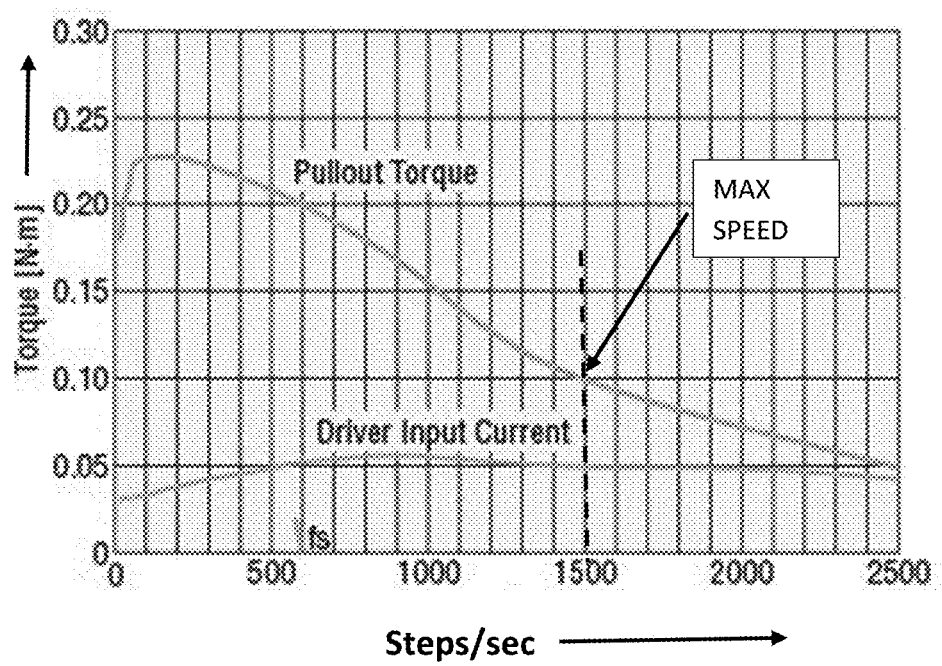
FIG. 7: Prior art

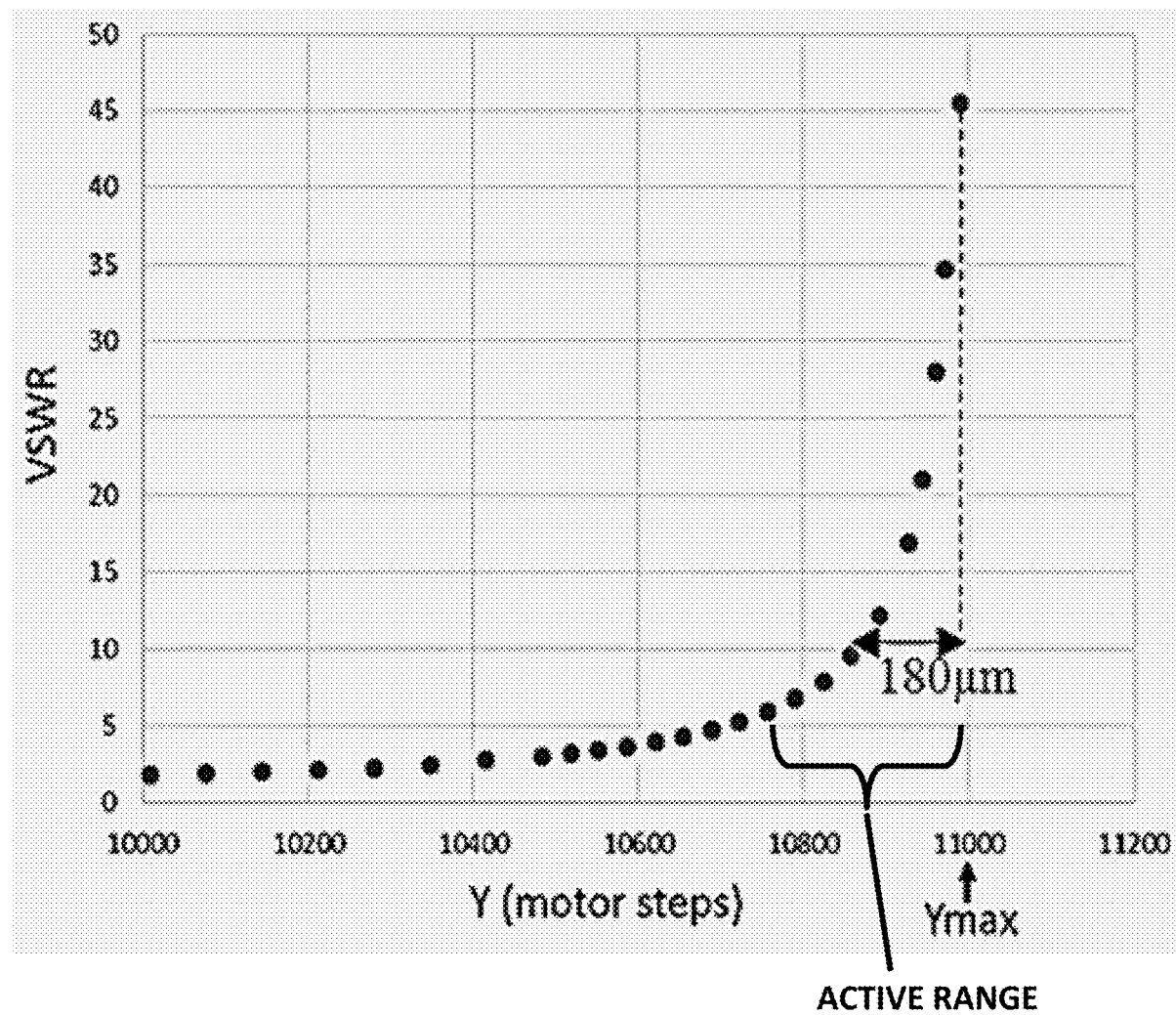
FIG. 9: Prior art

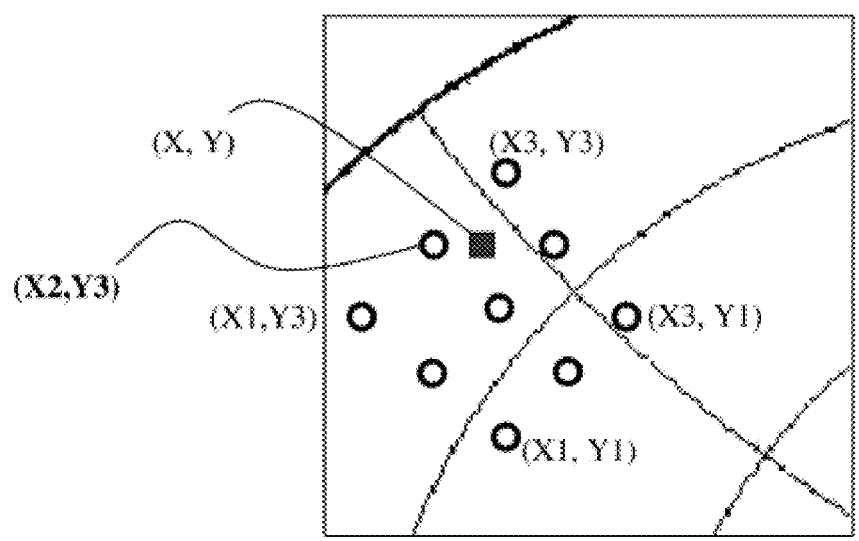
FIG. 11: Prior art

HIGH-SPEED HIGH-RESOLUTION SLIDE SCREW TUNER

PRIORITY CLAIM

Not Applicable.

CROSS-REFERENCE TO RELATED ARTICLES

1. "Computer Controlled Microwave Tuner-CCMT", Product Note 41, Focus Microwaves Inc., January 1998.
2. Stepper motors [online], Wikipedia [retrieved on 2020-07-03]. Retrieved from Internet <URL: https://en.wikipedia.org/wiki/Stepper_motor>.
3. Tsironis C, U.S. Pat. No. 9,625,556, "Method for calibration and tuning with impedance tuners".

BACKGROUND OF THE INVENTION

Modern design of high-power microwave amplifiers and oscillators, used in various telecommunication systems, requires accurate knowledge of the active device's (microwave transistor's) characteristics. Source- and Load-pull are measurement techniques used for this characterization employing microwave impedance tuners (see ref. 1) and other microwave test equipment. The microwave tuners are using the slide-screw technology and create the conditions (microwave impedances) under which the Device Under Test (DUT, or transistor) is tested. This invention relates to the remote movement control of such a slide screw impedance tuner.

A typical load pull measurement system is shown in FIG. 1. The tuners and the overall test system are controlled by a control computer (not shown), which is connected to the tuners and the test equipment using control cables. The electro-mechanical slide screw tuners (see ref. 1, FIG. 2) use adjustable metallic mechanical obstacles (RF tuning probes or slugs) inserted into the transmission media (slotted low loss airlines) of the tuners to reflect part of the power coming out of the device under test (DUT) and create this way adjustable reflection factors corresponding to microwave impedances presented to the DUT in order to perform the tests. The transmission media of the tuners are made using a low loss slotted coaxial airline or parallel plate airline (slabline), which has a, typically, cylindrical center conductor, a test port and an idle port. The tuners are built into a solid, torque resistant, housing (box), FIG. 2, and include: At least one mobile carriage which slides horizontally along the slabline (X) between a zero (X=0) reference position and up to one half a wavelength $X=\lambda/2$ at the lowest frequency of tuner operation, to allow a 360° reflection factor phase control; the mobile carriage holds the radio frequency (RF) tuning probe on a vertical axis; both carriage and tuning probe are controlled by electrical stepper motors (see ref. 2) ensuring the horizontal and vertical movement of the carriage (X) and the probe (Y). The probe is attached to a precision vertical axis, controlled by a first (vertical) stepper motor; the ACME lead screw, engages the mobile carriage, is responsible for its horizontal movement and is controlled by a second (horizontal) stepper motor using a transmission gear, made, typically, using a set of pulleys and a timing belt drive (FIG. 3); the two pulleys and the timing belt form a gear system, the translation ratio of which (the ratio of the pulley radii R1 and R2) can be configured at the factory. The "per inch" threads (PITCH) of the ACME lead screw in combination with the phase step of the stepper motor (typically 1.8°/step) and the ratio R1/R2 of the pulleys (FIG. 3) determine the minimum controllable increment of the horizontal movement. In general, the tuner calibration and tuning mathematics (see ref. 3) use generic motor steps and not physical distances (millimeters or micrometers) to describe the tuner movement. Each motor step corresponds to a different physical carriage movement increment according to the previously mentioned mechanical parameters.

BRIEF SUMMARY OF THE INVENTION

Control of the reflection factor phase $\Phi$ is created by the tuner through horizontal movement of the carriage and the partly or fully inserted tuning probe (see ref. 1). In order to cover a 360° circle of the reflection factor on the Smith Chart, (FIG. 8A), the available horizontal travel of the mobile carriage must be at least one half of a wavelength at the frequency of operation; for example, at 1 GHz the free travel must be 150 mm, at 0.5 GHz 300 mm etc. For a given ratio of pulleys R1 and R2 (FIG. 3) and an ACME screw PITCH (threads per inch or revolutions per inch) every motor phase step $\delta\Phi$ corresponds to a specific increment $\delta X$ in horizontal carriage (and probe) position (FIG. 2).

The horizontal step increment (FIG. 3, 4) is $\delta X=\delta\Phi*R1/(R2*PITCH)$, wherein $\delta\Phi$ is the stepper motor step angle (typically 1.8°), R1 is the radius of the pulley mounted on the motor axis, R2 is the radius of the pulley mounted on and controlling the ACME lead screw and PITCH is the per inch number of threads of the ACME lead screw. When PITCH or the ratio R2/R1 increase, the movement gets finer or the steps $\delta X$ become smaller. The quantities $\delta\Phi$, R1, R2 and PITCH are structurally given by the motor phase step ($\delta\Phi$) or built into the tuner mechanics (R1, R2, PITCH) and cannot be modified. This invention introduces a second gear with pulley ratio R3/R4 acting parallel to the original R1/R2; a high primary ratio R1/R2 and low PITCH are selected for coarse tuning and high tuning speed, and for fine tuning a low secondary ratio R3/R4 is chosen. Or, if R1/R2=1 and R3/R4=1/4, then we can have a 4:1 increased tuning speed when using the R1/R2 gear and a four times higher tuning resolution when using the R3/R4 gear. Since the pulleys R2 and R4 are both permanently mounted on the ACME lead screw, when either stepper motor drives the ACME it will tug the other motor with. This can be accommodated electrically by connecting only one motor with the electronic motor controller board, using a toggle switch (FIG. 6), while the control wires of the idle motor are left unconnected to avoid a breaking counter torque.

BRIEF DESCRIPTION OF THE DRAWINGS

The invention and its mode of operation will be better understood from the following detailed description when read with the appended drawings in which:

FIG. 7 depicts prior art, the dependence of stepper motor torque as a function of rotation speed of a 1.8°/step motor (200 steps/revolution).

FIG. 8A depicts two visibly adjacent points on the Smith chart; FIG. 8B depicts the associated tuning probe position along the slabline.

FIG. 9 depicts prior art, the amplitude of reflection factor GAMMA: {VSWR=(1+GAMMA)/(1−GAMMA)} as a function of vertical tuning probe position relative to the center conductor, showing the very small vertical travel required.

FIG. 11 depicts prior art, calibration and tuning points on the Smith chart (see ref. 3).

DETAILED DESCRIPTION OF THE INVENTION

Figure 1:
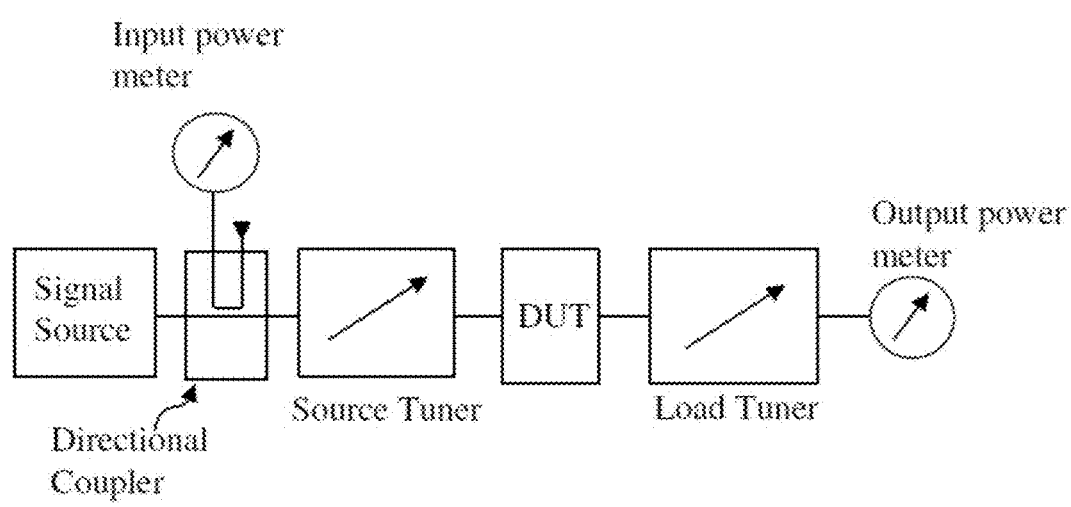
FIG. 1 depicts prior art, a block diagram of a load-pull measurement setup, in which electro-mechanical impedance tuners are used to manipulate the source and load impedances presented to the DUT.
Figure 2:
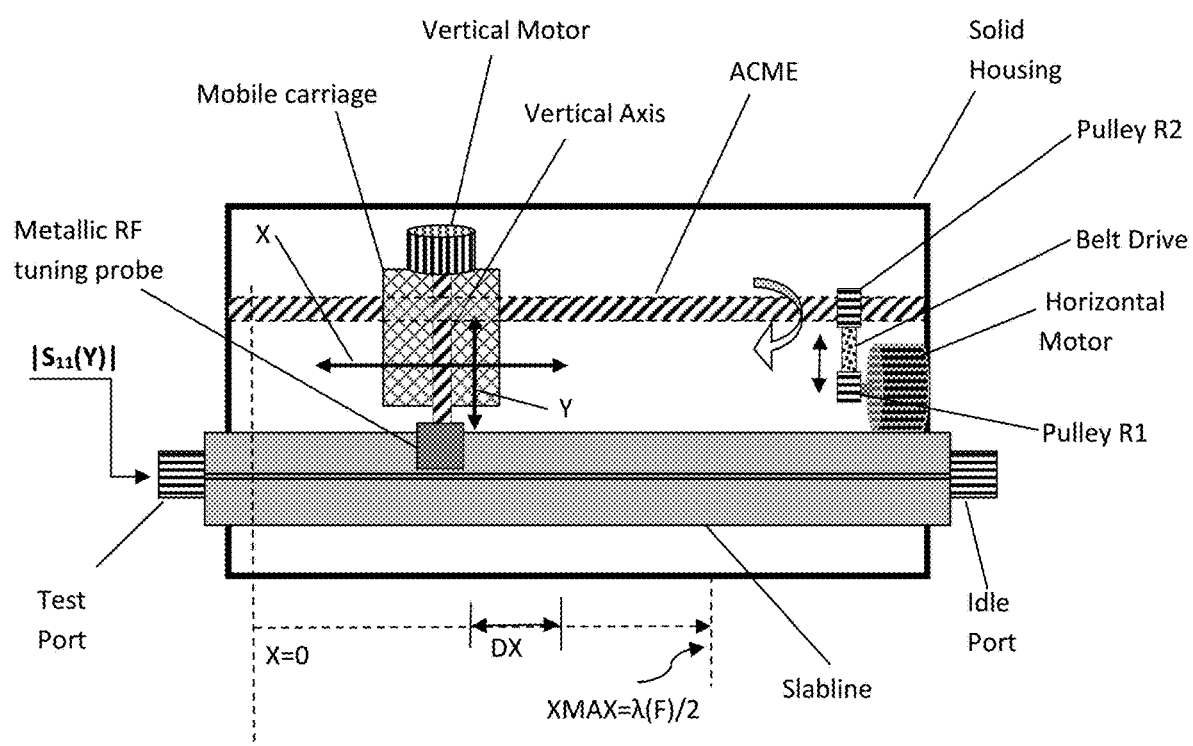
FIG. 2 depicts prior art, a front view of a slide screw tuner and associated components and definitions.
Figure 3:
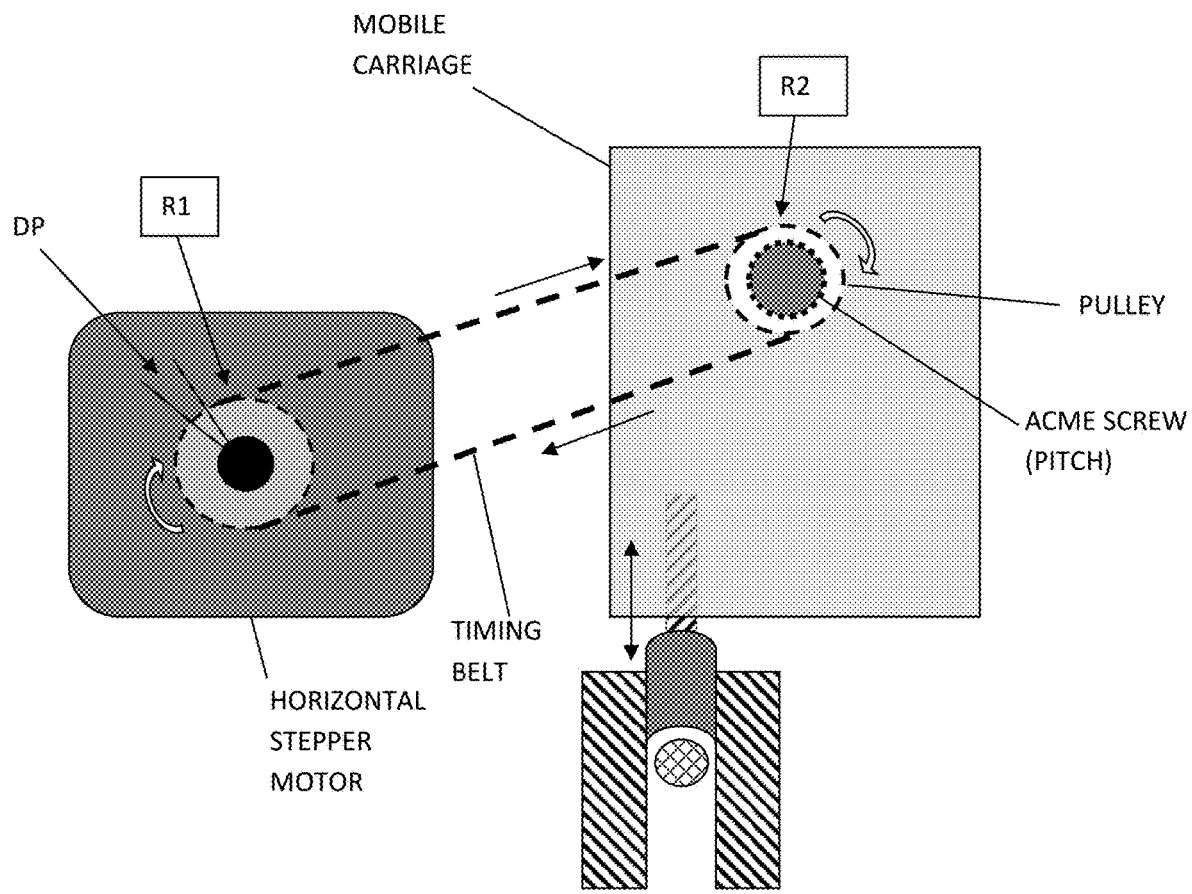
FIG. 3 depicts prior art, the horizontal position control of the mobile carriage using a set of pulleys, a timing belt drive and a stepper motor controlling the ACME lead screw moving the carriage.

The objective of this invention is a faster slide screw tuner using two remotely selectable inherent horizontal movement increments, allowing increased speed of the order of typically 4:1 to 8:1, at constant motor rotation speed, without loss of tuning resolution (i.e. minimum phase increment). Tuning speed is defined by the time it takes for the tuning probe to move from any actual position to the next. The probe moves horizontally and vertically. In both cases the lower the frequency and the bigger the size of the tuner, the longer the distances. However, the tuning behavior is different. Vertical probe movement controls the amplitude of the reflection factor while horizontal movement controls the phase. Whereas vertical movement changes the capacitance between tuning probe and center conductor (FIG. 2) following a hyperbolic law C~1/S, where S is the gap between probe and center conductor, horizontal movement controls the reflection factor phase following the linear law: $\Phi = -4*\pi*X/\lambda$), where X is the distance of the probe from a reference (zero) position, and $\lambda$ is the wavelength: $\lambda(mm) \approx 300/F(GHz)$.

Whereas vertical movement range is (due to the hyperbolic law) limited, as shown in FIG. 9 (effective tuning range is over approximately 200 steps, (between 10800 and 11000 steps) or approximately 0.3-0.5 mm throughout the frequency range, horizontally the movement range is always full one half of a wavelength (300 mm at 1 GHz, 30 mm at 10 GHz). The horizontal minimum increment (step size) must yield a phase resolution of approximately 0.25°-0.5° per step at the highest frequency of operation. At 18 GHz (typical range for an off-the-mill tuner) the required horizontal step size for 0.250 resolution is $\delta X = 5.8$ μm; the total travel V/2 at 0.8 GHz (the lowest frequency of the said off-the-mill tuner) is 375 mm which corresponds to 375 mm/5.8 μm≈64,600=XMAX steps. At a maximum rotation speed of 1500 steps/sec (FIG. 7) of a stepper motor this gives a horizontal travel time of 43 seconds and a vertical travel time of 200/1500=0.13 seconds. These approximations show that any speed increase effort must concentrate on horizontal movement.

Figure 4:
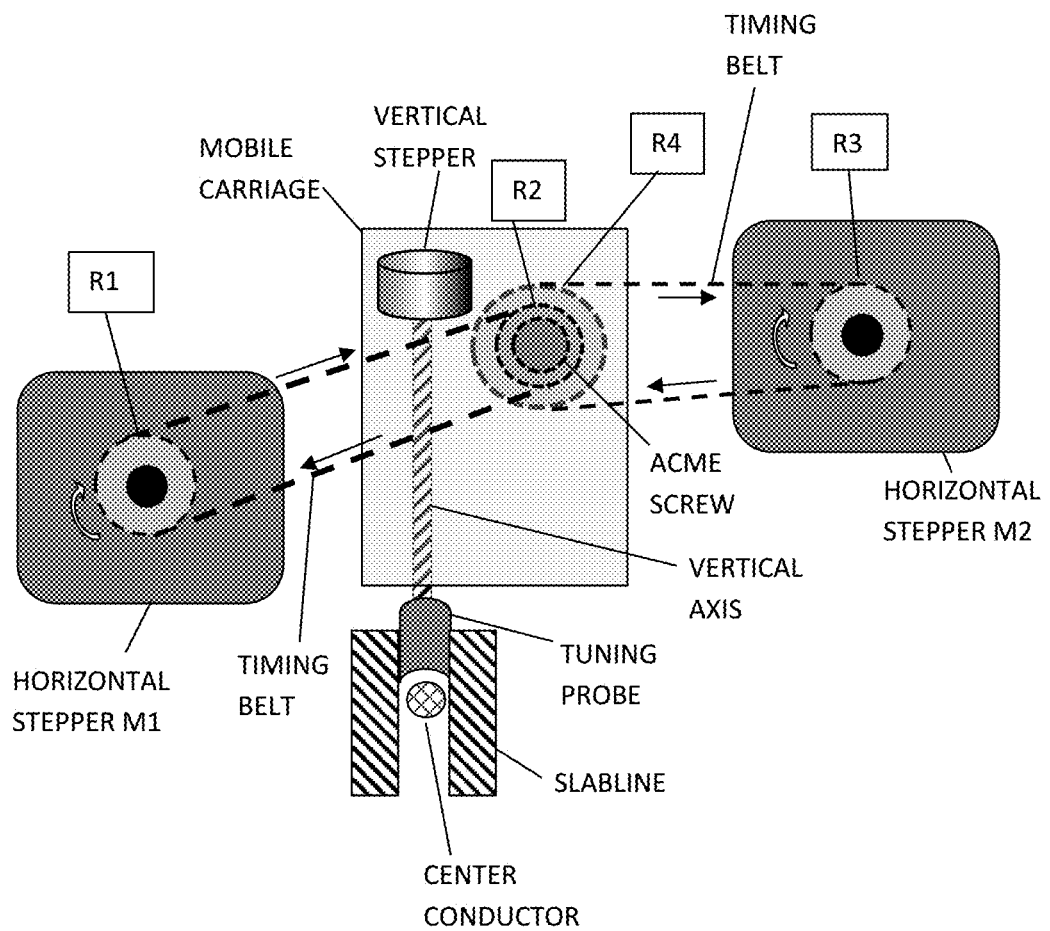
FIG. 4 depicts the horizontal position control of the mobile carriage using two controlling motors and two sets of control gear, each using a different set of pulleys mounted on the ACME and controlled by the two independent stepper motors.
Figure 5:
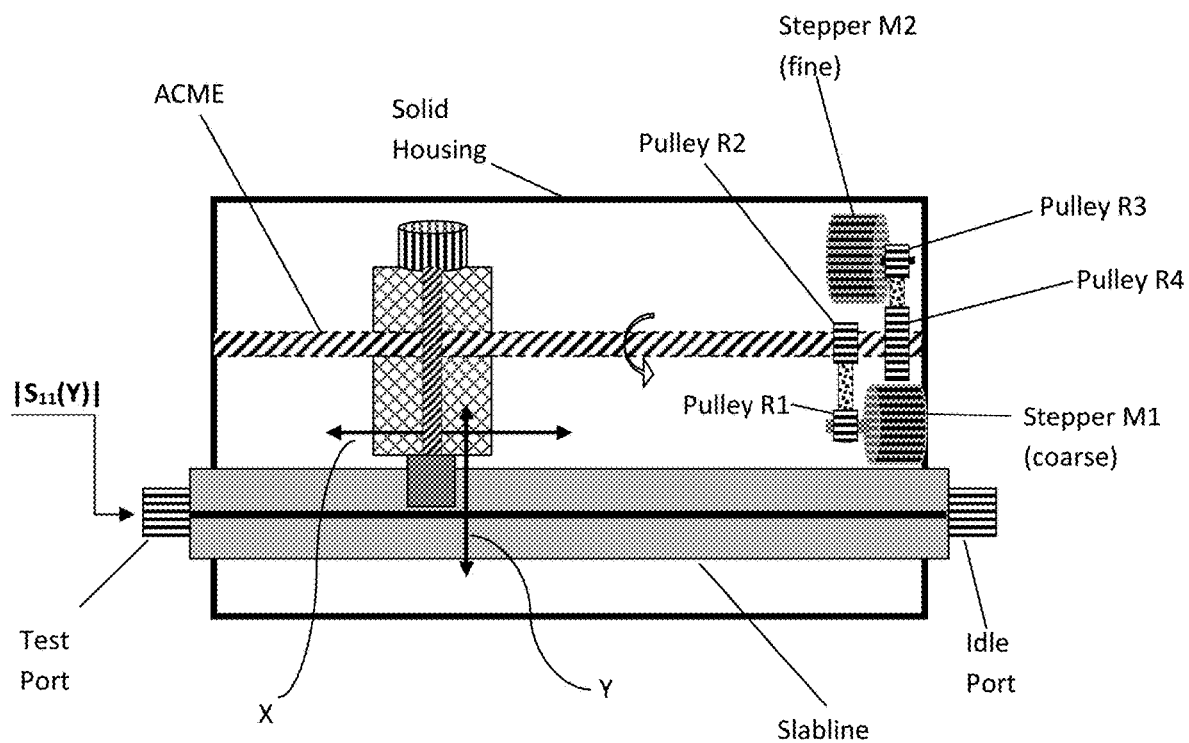
FIG. 5 depicts front view of slide screw tuner with fine and coarse step horizontal control gear.
Figure 6:
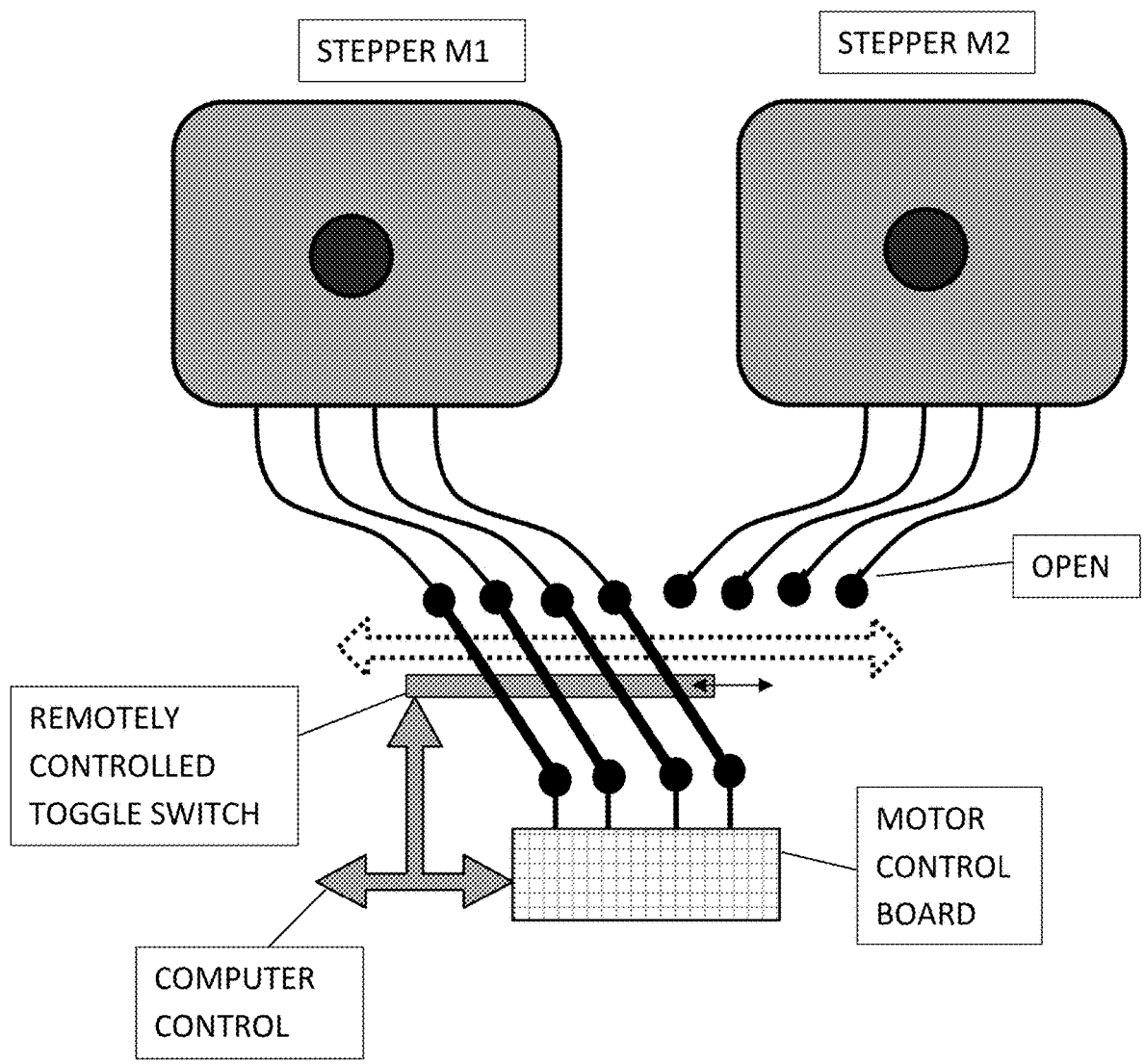
FIG. 6 depicts control of the two horizontal motors using a toggle switch and the electronic motor control board.

The proposed apparatus (FIG. 5) does this by changing the horizontal step size by a factor of 4 to 8. The large (coarse) step size uses pulleys R1 and R2 and can be set to 23.2 μm by choosing a smaller PITCH and a 1:1 pulley ratio, in which case the travel time at 0.8 GHz becomes approximately 10 seconds, while maintaining the fine resolution of 0.25° at 18 GHz using the pulleys R3 and R4 (FIG. 4) chosen to have a diameter ratio of 1:4 yielding the basic 5.8 μm increment as before. If the R3/R4 pulley ratio is chosen to 1:6 or 1:8 the movement speed by the R1/R2 pulleys or the PITCH can be increased further proportionally to increase the coarse step size and the speed while maintaining a fine-tuning resolution.

Figure 8A:
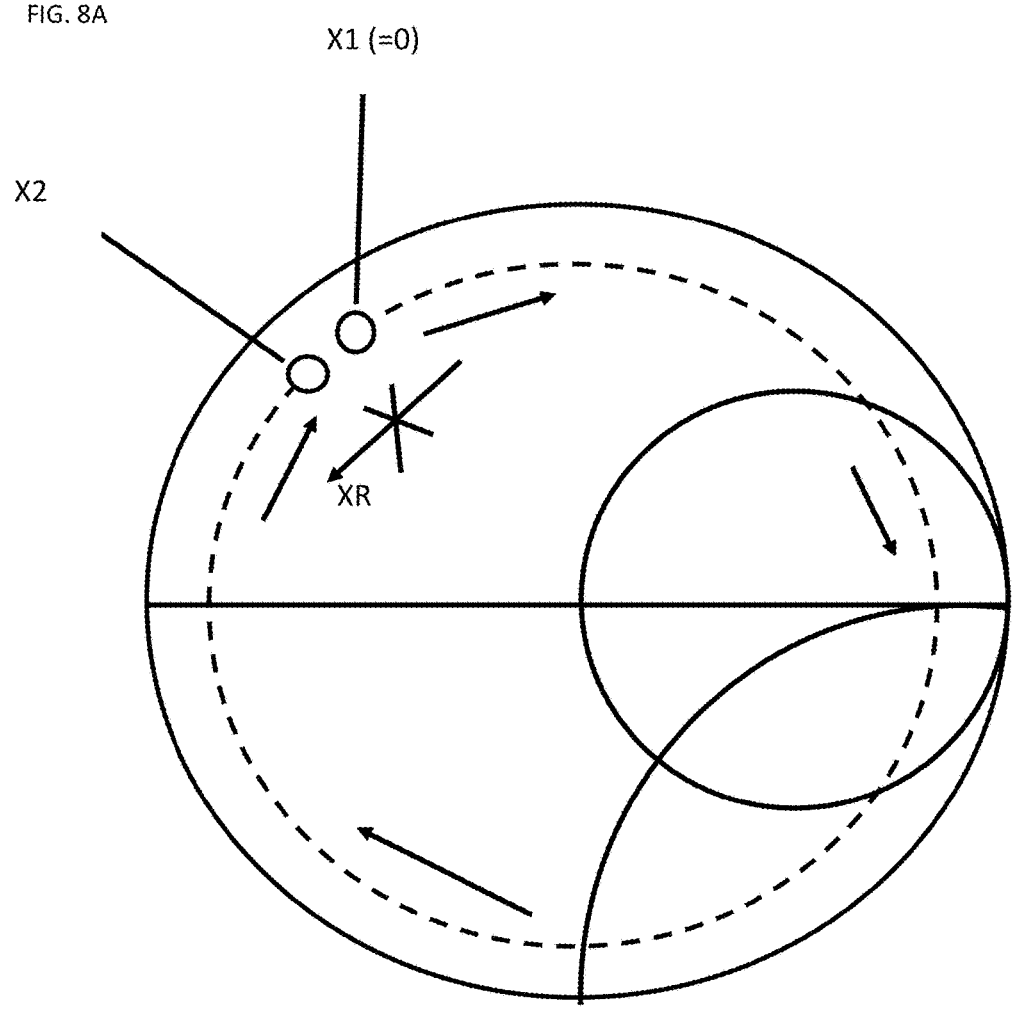
FIGS. 8A through 8B depict reflection factor points and probe position.
Figure 8B:
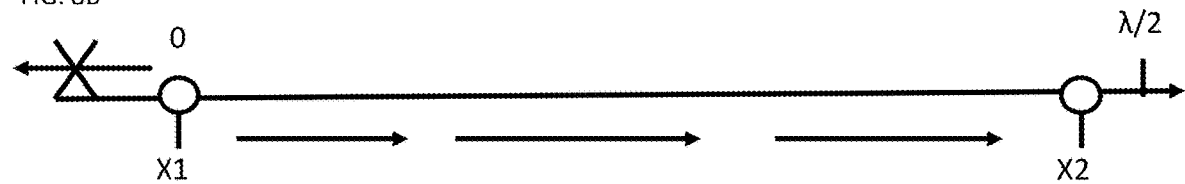

The requirement for higher speed without loss of tuning resolution can be seen from FIGS. 8A and 8B and FIG. 11: To tune between two, apparently adjacent on the Smith chart, reflection factor points X1 and X2, it often happens that one has to travel all around the circle, because the tuner calibration is always restricted to a horizontal movement by one half of a wavelength ($\lambda/2$); if X1 is the closest position to either zero or $\lambda/2$ a reverse movement XR or moving beyond 12 to reach point X2 can in neither case be executed (FIG. 8B).

Figure 10:
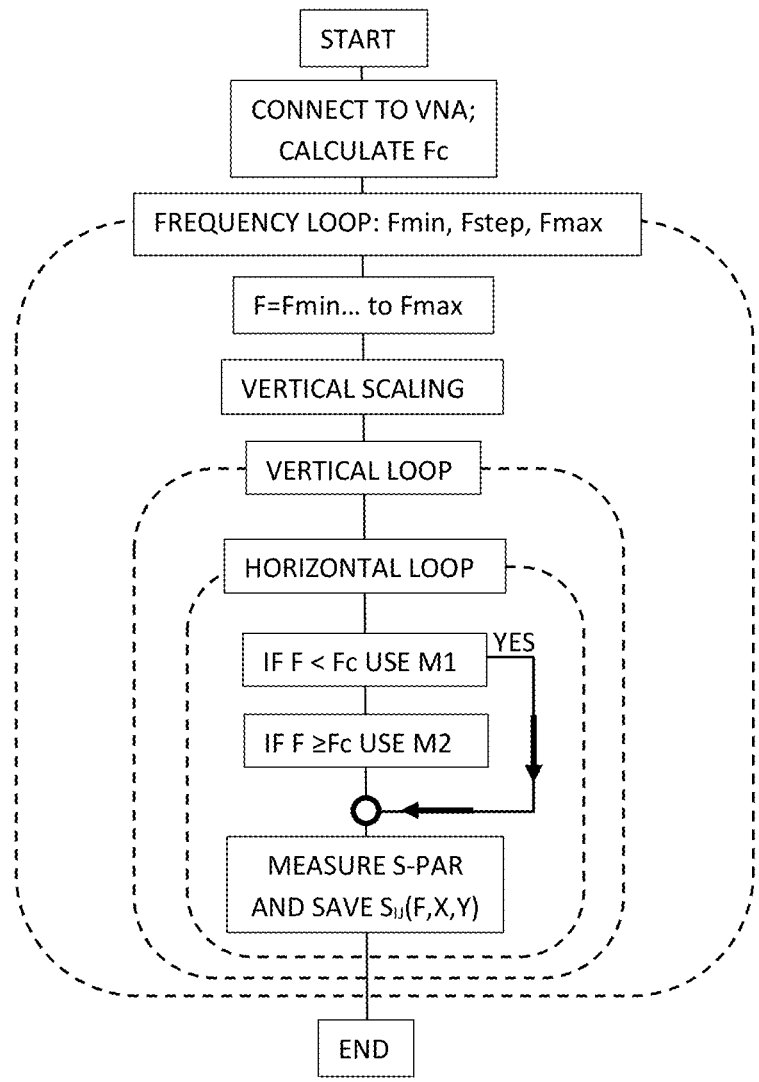
FIG. 10 depicts flow chart of tuning probe moving algorithm.

Tuner calibration is, beyond tuning, a time-consuming operation, that can be sped up. Tuner calibration always includes two major steps: 1) vertical scaling and 2) point selection for best coverage of the reflection factor space and measurement and saving of s-parameters. The method for prior art tuners has been described in ref. 3, FIG. 12, column 5. The criterion of which horizontal step size to use is the required minimum phase step $\Delta\Phi((°)$ at the highest frequency (FIG. 10). This can be calculated using the relation $\Delta\Phi(°) = 720(°)*\delta X/\lambda = 2.4*\delta X(mm)*F(GHz)$ whereby $\delta X = 1.8 (°)*R1/(R2*PITCH)$; leading to the following criterion: $Fc = \Delta\Phi(°)/(2.4*\delta X)$; whereby Fc is the cross-over frequency depending on the minimum required phase step $\Delta\Phi(°)$, the built-in ACME lead screw PITCH and the horizontal increment of the basic (coarse) gear ratio R1/R2. Typical PITCH values of ACME lead screws are 4-48, corresponding to 31.75 μm-2.65 μm horizontal increments per motor step. Low PITCH is created by using ACME screws with 2, 3 or 4 thread starts and multiple intervening threads. As an example: If the selected PITCH and the R1/R2 ratio creates a $\delta X = 50$ μm=0.05 mm, and the required phase resolution at a highest frequency of operation shall be $\Delta\Phi = 0.5°$, then the cross-over frequency for the calibration is Fc=4.17 GHz. At all frequencies below Fc only coarse motor M1 step is used, both for calibration and tuning, including the numeric calculations (see ref. 3, column 5, lines 62-63), and above Fc only motor M2 is used for tuning computations (the determination of probe positions for creating a specific reflection factor), whereas for moving the probe an optimum combination of motors M1 and M2 are used, as outlined below.

A first embodiment of an improved movement algorithm must decide if the required relative horizontal travel distance from the actual position of the tuning probe X0 to a target position XT: $\Delta X = |XT-X0|/XMAX$ is smaller than the ratio $R2*R3/(R1*R4)$ then we activate fine step motor M2 (R3, R4), else we use coarse step motor M1 (R1,R2). If the maximum horizontal movement of $\lambda/2$ at the specific frequency F>Fc corresponds to XMAX motor steps (of motor M2), and the horizontal difference between the actual probe position and target probe position is $\Delta X$; then the portion $(1-R2*R3/(R1*R4))$ of $\Delta X$ is covered by coarse (and fast) movement of M1 and the remaining by (fine) movement of M2.

In a second embodiment of a further improved movement algorithm any travel distance ΔX can be covered most efficiently if the major portion is covered with the coarse step (motor M1) and the remaining part with the fine step (motor M2). Since calibration and numerical tuning (determination of target positions of the tuning probe) operations execute always using the appropriate step as decided by comparing the calibration frequency F with the cross-over frequency Fc (for F<Fc use motor M1, for F≥Fc use motor M2) (see ref. 3), every distance ΔX can be made up as: ΔX=A*COARSE-STEP+B*FINE-STEP=ΔXC+ΔXF; herein M1 is activated for ΔXC and M2 for ΔXF. As an example: Consider δXC=4*δXF. If F>Fc and ΔX=5455 fine steps, then the fastest movement is 5455/4=1363.75 or 1364 steps with M1 and 1 step backwards with M2, which, using 1500 steps/sec motors would last roughly 1 instead of 4 seconds. In terms of equations this can be described as follows: if, at F>Fc, the maximum horizontal movement of λ/2 corresponds to XMAX fine motor M2 steps, and the horizontal difference between the actual probe position and target probe position is ΔX, then the portion (int)(ΔX*R4/R3) is covered by coarse movement of motor M1 and the remaining portion ΔX*R4/R3−(int)(ΔX*R4/R3) is covered by fine movement of motor M2. Herein (int) is defined as follows: (int)(2.3)=2; (int)(2.55)=(int)(2.5)=3.

What is not immediately obvious from FIG. 11 is the included motor steps, i.e. the addressable probe positions, between calibration anchor points [X1,Y1] to [X3,Y3]. Assume the mechanically fixed PITCH is 12 and there will be 10 controllable positions between X2 and X3, where the target X is located; if the effective PITCH is increased by a factor of 4 from 12 to 48, then there will be 40 controllable positions between X2 and X3. That is, we can increase the tuning resolution without changing the anchoring calibration points or the tuning theory disclosed in ref. 3, column 5, lines 62-63.

The slide screw tuner with automatic selection between two movement speeds, without loss of high tuning resolution, and the associated calibration and movement control algorithms have been disclosed using preferred embodiments. Obvious alternatives, though imaginable, shall not impede on the validity of the present invention.

What is claimed is:

1. A slide screw impedance tuner comprising,
  a low loss slotted transmission airline (slabline) having a test port, an idle port and a center conductor between the ports,
  and
    at least one remotely controlled mobile carriage sliding horizontally along the slabline, and an electronic motor control board;
    said at least one carriage comprising at least one, remotely controlled, vertical axis holding a metallic tuning probe insertable into the slot of the slabline;
  and
    an ACME lead screw controlling the horizontal position of the at least one carriage along the slabline,
  wherein;
    the ACME lead screw is controlled by horizontal stepper motors M1 and M2 wherein
      motor M1 controls the ACME lead screw using a set R12 of two pulleys R1 and R2 and a timing belt,
      and
      motor M2 controls the ACME lead screw using a set R34 of two pulleys R3 and R4 and a timing belt,
  and wherein;
    the set R12 of pulleys has a primary pulley R1 mounted on the axis of motor M1 and a secondary pulley R2 mounted on the ACME lead screw, and
    the set R34 of pulleys has a primary pulley R3 mounted on the axis of motor M2 and a secondary pulley R4 mounted on the ACME lead screw,
  and wherein;
    the R12 set of pulleys has a ratio of the pulley radii R1/R2 and the R34 set of pulleys has a ratio of the pulley radii R3/R4.

2. The tuner of claim 1
  wherein
    the ratio R1/R2 varies typically between 1/1 and 1/2, and the ratio R3/R4 varies typically between 1/4 and 1/8.

3. The tuner of claim 1
  wherein
    the motors are controlled via control wires and wherein a toggle switch links the control wires of motor M1 or motor M2, alternatively, to the electronic motor control board, and wherein the electronic motor control board is linked with to a control computer,
  and wherein
    the control wires of the non-linked motor are kept open-circuited.

4. Calibration method for the tuner as in claim 3,
  wherein
    a) the tuner is connected to a pre-calibrated vector network analyzer;
    b) the cross-over frequency Fc is calculated;
    c) in a frequency (F) loop from a minimum frequency (Fmin) to a maximum frequency (Fmax)
      i) execute vertical scaling;
      ii) if F<Fc use motor M1, else use motor M2;
      iii) move tuning probe to a multitude of horizontal (X) and vertical (Y) positions;
      iv) measure s-parameters and save in a calibration file.

5. Movement control algorithm for the tuner of claim 3,
  wherein;
    the maximum horizontal movement of λ/2 corresponds to XMAX motor steps of motor M2, and the absolute horizontal difference between an actual probe position and a target probe position is ΔX;
  and wherein
    the portion (1−R2*R3/(R1*R4)) of ΔX is covered by movement of M1 and the remaining by movement of M2.

6. Movement control algorithm for the tuner of claim 3,
  wherein;
    the maximum horizontal movement of λ/2 corresponds to XMAX motor steps of motor M2, and the absolute horizontal difference between an actual probe position and a target probe position is ΔX;
  and wherein
    the portion (int)(ΔX*R4/R3) is covered by movement of M1 and the portion ΔX*R4/R3−(int)(ΔX*R4/R3) is covered by movement of M2.

* * * * *